US009711602B2

(12) United States Patent
Li et al.

(10) Patent No.: US 9,711,602 B2
(45) Date of Patent: Jul. 18, 2017

(54) METHOD OF MAKING THIN FILM TRANSISTOR ARRAY AND SOURCE/DRAIN CONTACT VIA-INTERCONNECT STRUCTURES FORMED THEREBY

(71) Applicant: BOE TECHNOLOGY GROUP CO., LTD., Beijing (CN)

(72) Inventors: Liangjian Li, Beijing (CN); Yueping Zuo, Beijing (CN); Yinghai Ma, Beijing (CN); Xiaowei Xu, Beijing (CN)

(73) Assignee: BOE TECHNOLOGY GROUP CO., LTD., Chaoyang District, Beijing (CN)

( * ) Notice: Subject to any disclaimer, the term of this patent is extended or adjusted under 35 U.S.C. 154(b) by 0 days.

(21) Appl. No.: 15/116,195

(22) PCT Filed: Feb. 22, 2016

(86) PCT No.: PCT/CN2016/074216
§ 371 (c)(1),
(2) Date: Aug. 2, 2016

(87) PCT Pub. No.: WO2016/206394
PCT Pub. Date: Dec. 29, 2016

(65) Prior Publication Data
US 2017/0148884 A1    May 25, 2017

(30) Foreign Application Priority Data
Jun. 25, 2015 (CN) .......................... 2015 1 0359405

(51) Int. Cl.
*H01L 29/12* (2006.01)
*H01L 29/417* (2006.01)
(Continued)

(52) U.S. Cl.
CPC ...... *H01L 29/41733* (2013.01); *H01L 23/535* (2013.01); *H01L 27/124* (2013.01);
(Continued)

(58) Field of Classification Search
CPC ............... H01L 27/124; H01L 27/1248; H01L 27/1288; H01L 29/41733
See application file for complete search history.

(56) References Cited

U.S. PATENT DOCUMENTS 5,053,347 A * 10/1991 Wu .................... H01L 29/78648
257/57
5,742,363 A * 4/1998 Bae .................... H01L 29/42384
257/336

(Continued)

FOREIGN PATENT DOCUMENTS

| CN | 103151359 A | 6/2013 |
| CN | 104362125 A | 2/2015 |
| CN | 102629664 A | 8/2015 |

OTHER PUBLICATIONS

International Search Report & Written Opinion mailed May 25, 2016 regarding PCT/CN2016/074216.

*Primary Examiner* — Evan Pert
(74) *Attorney, Agent, or Firm* — Intellectual Valley Law, P.C.

(57) ABSTRACT

The present application discloses a thin film transistor comprising active layer on a base substrate; an insulating layer over the active layer, the insulating layer comprising a source via and a drain via, each of which extending through the insulating layer; a source electrode within the source via in contact with the active layer; and a drain electrode within the drain via in contact with the active layer.

18 Claims, 5 Drawing Sheets

(51) Int. Cl.
  *H01L 29/423* (2006.01)
  *H01L 27/12* (2006.01)
  *H01L 29/06* (2006.01)
  *H01L 29/786* (2006.01)
  *H01L 23/535* (2006.01)
  *H01L 29/66* (2006.01)

(52) U.S. Cl.
  CPC ...... *H01L 27/1222* (2013.01); *H01L 27/1248* (2013.01); *H01L 27/1288* (2013.01); *H01L 29/0649* (2013.01); *H01L 29/42384* (2013.01); *H01L 29/6675* (2013.01); *H01L 29/78684* (2013.01)

(56) References Cited

U.S. PATENT DOCUMENTS

| | | | | |
|---|---|---|---|---|
| 6,034,748 A * | 3/2000 | Furuta | ................ | H01L 27/1214 257/66 |
| 6,232,158 B1 * | 5/2001 | Lee | ................ | H01L 29/41733 257/E21.414 |
| 6,329,672 B1 * | 12/2001 | Lyu | ................ | H01L 29/4908 257/347 |
| 7,122,954 B2 * | 10/2006 | Nozawa | ................ | H01L 27/3244 313/500 |
| 7,205,565 B2 * | 4/2007 | Im | ................ | H01L 27/1248 257/40 |
| 7,215,387 B2 * | 5/2007 | Yang | ................ | G02F 1/136227 257/E27.113 |
| 7,344,926 B2 * | 3/2008 | Yang | ................ | G02F 1/13454 257/E21.411 |
| 7,709,842 B2 * | 5/2010 | Jung | ................ | H01L 27/3244 257/59 |
| 8,063,550 B2 * | 11/2011 | Kim | ................ | H01L 27/3244 313/503 |
| 8,273,615 B2 * | 9/2012 | Park | ................ | H01L 29/66757 438/149 |
| 9,335,593 B2 * | 5/2016 | Nakagawa | ................ | G02F 1/136204 |
| 2002/0158995 A1 * | 10/2002 | Hwang | ................ | G02F 1/136227 349/43 |
| 2004/0027503 A1 * | 2/2004 | Tanaka | ................ | G02F 1/133371 349/43 |
| 2004/0217695 A1 * | 11/2004 | Yoneda | ................ | H01L 51/0011 313/504 |
| 2005/0142680 A1 * | 6/2005 | Ha | ................ | G02F 1/136227 438/30 |
| 2007/0238218 A1 * | 10/2007 | Teng | ................ | H01L 27/322 438/99 |
| 2009/0147208 A1 * | 6/2009 | Tatemori | ................ | G02F 1/13394 349/156 |
| 2010/0009478 A1 | 1/2010 | Yang | | |
| 2010/0129967 A1 * | 5/2010 | Liao | ................ | H01L 27/1288 438/151 |
| 2010/0155733 A1 * | 6/2010 | Moon | ................ | G02F 1/136227 257/59 |

* cited by examiner

METHOD OF MAKING THIN FILM TRANSISTOR ARRAY AND SOURCE/DRAIN CONTACT VIA-INTERCONNECT STRUCTURES FORMED THEREBY

CROSS-REFERENCE TO RELATED APPLICATION

This application is a national stage application under 35 U.S.C. §371 of International Application No. PCT/CN2016/074216 filed Feb. 22, 2016, which claims priority to Chinese Patent Application No. 201510359405.9, filed Jun. 25, 2015, the contents of which are incorporated by reference in the entirety.

TECHNICAL FIELD

The present invention relates to display technology, more particularly, to a thin film transistor, an array substrate and a display panel having the same, and a fabricating method thereof.

BACKGROUND

Organic light emitting diodes (OLED) use the principles of electrophosphorescence to convert electrical energy in an OLED into light in a highly efficient manner. OLEDs are self-emitting apparatuses that do not require a backlight. Having the advantages of a wide viewing angle, high brightness, high contrast, and fast response, they have found a wide range of applications in display field.

SUMMARY

In one aspect, the present invention provides a thin film transistor comprising an active layer on a base substrate; an insulating layer over the active layer, the insulating layer comprising a source via and a drain via, each of which extends through the insulating layer; a source electrode within the source via in contact with the active layer; and a drain electrode within the drain via in contact with the active layer.

Optionally, the source via and the drain via are completely within the insulating layer.

Optionally, the source electrode and the drain electrode are completely within the insulating layer.

Optionally, the active layer is made of a material comprising a polycrystalline silicon.

Optionally, the insulating layer is on a side of the active layer distal to the base substrate.

Optionally, the source via comprising a first source sub-via distal to the active layer and a second source sub-via proximal to the active layer, the drain via comprising a first drain sub-via distal to the active layer and a second drain sub-via proximal to the active layer; the first source sub-via has a diameter larger than that of the second source sub-via, and the first drain sub-via has a diameter larger than that of the second drain sub-via.

Optionally, thin film transistor further comprises a gate electrode insulated from the active layer by the insulating layer.

Optionally, the insulating layer comprises a gate insulating layer and an interlayer insulating layer; the gate insulating layer is on a side of the active layer distal to the base substrate; the interlayer insulating layer is on a side of the gate insulating layer distal to the active layer; the gate electrode is on a side of the gate insulating layer distal to the active layer, and on a side of the interlayer insulating layer proximal to the active layer.

Optionally, the first source sub-via and the first drain sub-via is within the interlayer insulating layer.

In another aspect, the present invention provides a method of fabricating a thin film transistor, comprising forming an active layer on a base substrate; forming an insulating layer over the active layer; forming a source via and a drain via in the insulating layer, each of which extends through the insulating layer; and forming a source electrode within the source via in contact with the active layer and forming a drain electrode within the drain via in contact with the active layer.

Optionally, the source via and the drain via are completely within the insulating layer.

Optionally, the source electrode and the drain electrode are completely within the insulating layer.

Optionally, the step of forming the source electrode and forming the drain electrode comprises depositing a source/drain electrode metal layer on a side of the insulating layer distal to the active layer, wherein the source/drain electrode metal layer extends through the source via and is in contact with the active layer, the source/drain electrode metal layer extends through the drain via and is in contact with the active layer; coating a photoresist layer on a side of the source/drain electrode metal layer distal to the insulating layer; removing the photoresist layer to expose a portion of the source/drain electrode metal layer other than a portion corresponding to the source electrode and the drain electrode; and etching exposed source/drain electrode metal layer.

Optionally, the source via comprising a first source sub-via distal to the active layer and a second source sub-via proximal to the active layer, the drain via comprising a first drain sub-via distal to the active layer and a second drain sub-via proximal to the active layer; the step of forming the source via and the drain via comprises using a gray-tone mask plate or a half-tone mask plate to obtain a pattern, wherein the pattern comprises a first section corresponding to the source via and the drain via and a second section corresponding to remaining portion of the insulating layer. The first section comprising a first zone corresponding to the second source sub-via and the second drain sub-via; and a second zone corresponding to remaining portions of the first section.

Optionally, the step of forming the active layer comprises forming an amorphous silicon layer, annealing the amorphous silicon layer thereby forming a polycrystalline silicon layer, and patterning the polycrystalline silicon layer to form the active layer.

Optionally, the step of forming the insulating layer comprises forming a gate insulating layer on a side of the active layer distal to the base substrate; and forming an interlayer insulating layer on a side of the gate insulating layer distal to the active layer.

Optionally, the first source sub-via and the first drain sub-via is within the interlayer insulating layer.

Optionally, the method further comprises forming a gate electrode insulated from the active layer by the insulating layer; the gate electrode is on a side of the gate insulating layer distal to the active layer, and on a side of the interlayer insulating layer proximal to the active layer.

Optionally, the source via comprising a first source sub-via distal to the active layer and a second source sub-via proximal to the active layer, the drain via comprising a first drain sub-via distal to the active layer and a second drain sub-via proximal to the active layer; the first source sub-via has a diameter larger than that of the second source sub-via, and the first drain sub-via has a diameter larger than that of the second drain sub-via.

Optionally, the insulating layer is on a side of the active layer distal to the base substrate.

In another aspect, the present invention provides an array substrate comprising the thin film transistor described herein or manufactured by a method described herein.

Optionally, the array substrate further comprises a buffer layer between the base substrate and the active layer.

Optionally, the array substrate further comprises a source/drain line trench extending from a first source electrode in one thin film transistor to a second source electrode in a neighboring thin film transistor, the source/drain line trench is completely within the insulating layer in an area corresponding to the source via; and a source/drain line in the source/drain line trench.

In another aspect, the present invention provides a display panel comprising an array substrate described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1A:
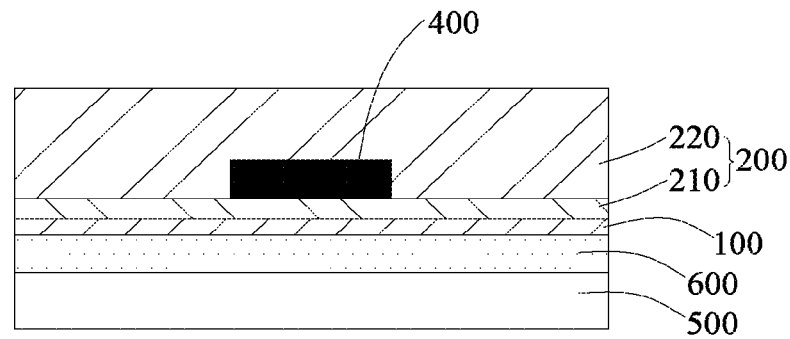
FIG. 1A is a diagram illustrating the structure of a conventional thin film transistor having an active layer, a gate insulating layer, a gate electrode, and an interlayer insulating layer on a base substrate.
Figure 1B:
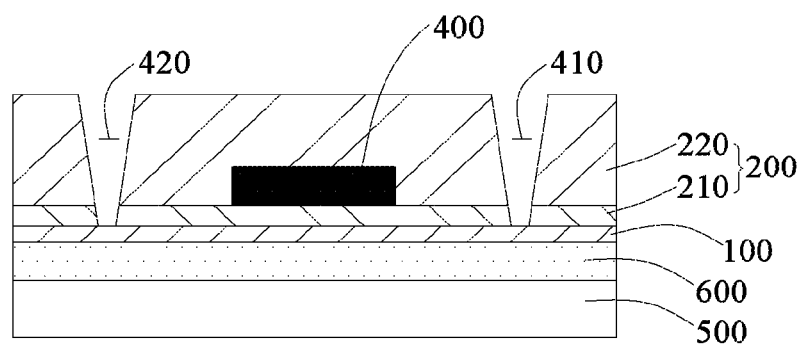
FIG. 1B is a diagram illustrating the structure of a conventional thin film transistor having a via.
Figure 1C:
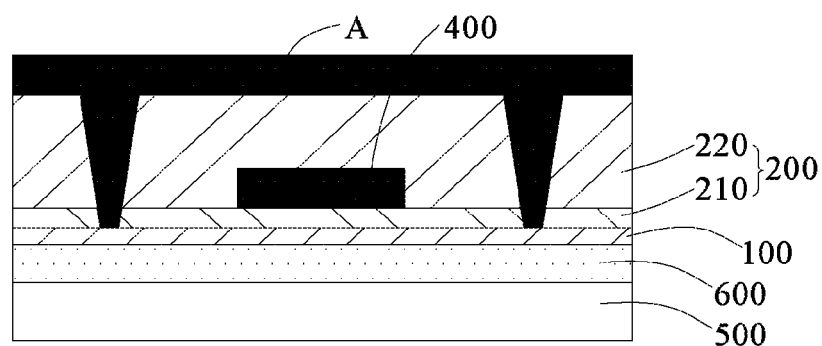
FIG. 1C is a diagram illustrating the structure of a conventional thin film transistor having a source/drain metal layer.
Figure 1D:
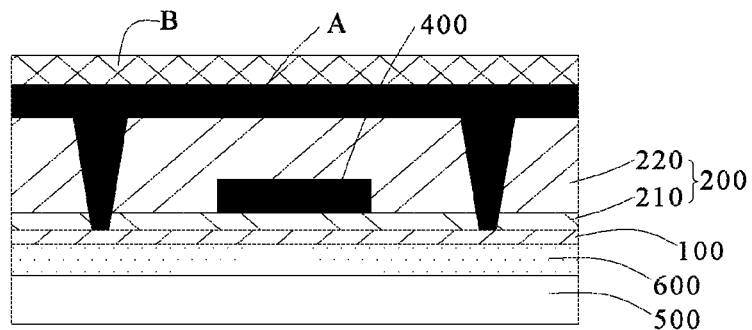
FIG. 1D is a diagram illustrating the structure of a conventional thin film transistor having a photoresist layer on the source/drain metal layer.
Figure 1E:
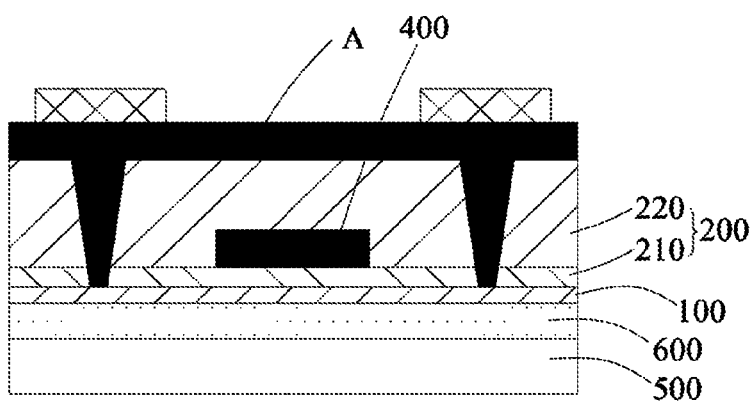
FIG. 1E is a diagram illustrating the structure of a conventional thin film transistor having a mask formed by a photoresist.
Figure 1F:
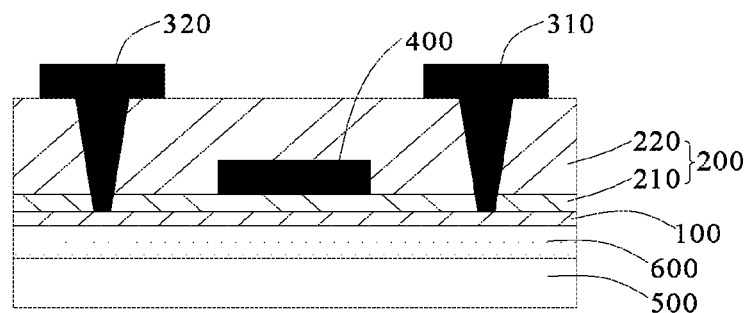
FIG. 1F is a diagram illustrating the structure of a conventional thin film transistor having a source electrode and a drain electrode patterned.

FIGS. 1A-F illustrate a method of fabricating a conventional thin film transistor. The method includes forming a buffer layer 600 on a base substrate 500, forming an active layer 100 on a side of the buffer layer 600 distal to the base substrate 500, forming a gate insulating layer 210 on a side of the active layer 100 distal to the base substrate 500, forming a gate electrode 400 on a side of the gate insulating layer distal to the base substrate 500, forming an interlayer insulating layer 220 on a side of the gate electrode 400 distal to the base substrate 500 (FIG. 1A). The insulating layer 200 includes the gate insulating layer 210 and the interlayer insulating layer 220. The method further includes patterning the interlayer insulating layer 220 using a mask, forming a source via 410 and a drain via 420 (FIG. 1B), forming a source/drain metal layer A (FIG. 1C), forming a first photoresist layer B on a side of the source/drain metal layer A distal to the base substrate 500 (FIG. 1D), etching the first photoresist layer B to forming a mask corresponding to a source electrode and a drain electrode (FIG. 1E), and etching the source/drain metal layer A to obtain a source electrode 310 and a drain electrode 320. Because the method involves using of two masks in order to fabricate the thin film transistor, the manufacturing cost is relatively high.

In one aspect, the present disclosure provides a novel thin film transistor. In some embodiments, the thin film transistor includes an active layer 100 on a base substrate 500 and an insulating layer 200 over the active layer 100 (see FIG. 2E). The insulating layer 200 includes a source via and a drain via, each of which extends through the insulating layer 200 to the surface of the active layer 100.

In some embodiments, the source via and the drain via are completely within the insulating layer. In some embodiments, the source via includes (e.g., consists of) a first source sub-via distal to the active layer 100 and a second source sub-via proximal to the active layer 100, and the drain via includes (e.g., consists of) a first drain sub-via distal to the active layer 100 and a second drain sub-via proximal to the active layer 100. Optionally, the first source sub-via and the first drain sub-via completely within the insulating layer 200. Optionally, the second source sub-via and the second drain sub-via are completely within the insulating layer 200.

The thin film transistor in the embodiment further includes a source electrode 310 within the source via and a drain electrode 320 within the drain via. The source electrode 310 is in contact with the active layer 100 (e.g., through the second source sub-via). The drain electrode 320 is in contact with the active layer 100 (e.g., through the second drain sub-via). For example, the source via (e.g., the first source sub-via and the second source sub-via) is deposited (e.g., filled or sputtered) with a source electrode material, the drain via (e.g., the first drain sub-via and the second drain sub-via) is deposited (e.g., filled or sputtered) with a drain electrode material. Optionally, the first source sub-via has a diameter larger than that of the second source sub-via, and the first drain sub-via has a diameter larger than that of the second drain sub-via. For example, as shown in FIG. 2E, the source via and the drain via are step vias, each having an upper portion and a lower portion. The upper portion is wider than the lower portion in horizontal direction. Optionally, the source electrode 310 and the drain electrode 320 are completely within the insulating layer 200. Optionally, the source electrode 310 includes (e.g., consists of) a first part within the first source sub-via and a second part within the second source sub-via, and the drain electrode 320 includes (e.g., consists of) a first part within the first drain sub-via and a second part within the second drain sub-via.

Figure 2A:
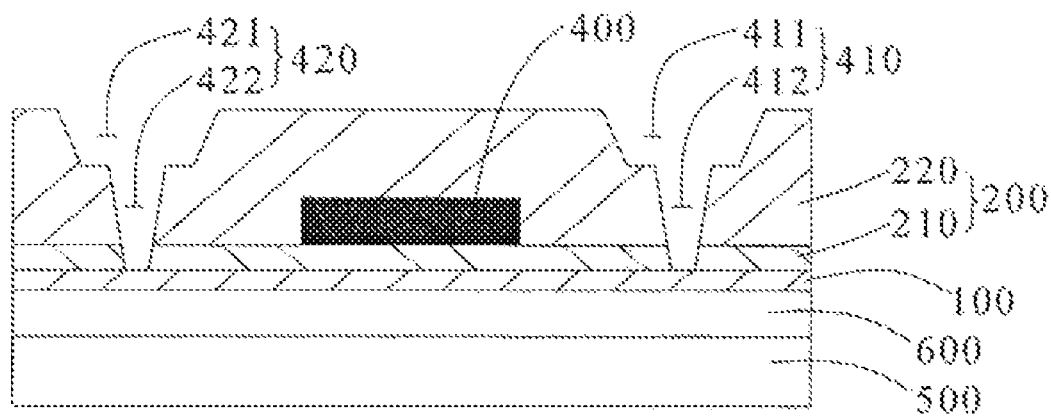
FIG. 2A is a diagram illustrating the structure of a thin film transistor having a via in some embodiments.
Figure 2B:
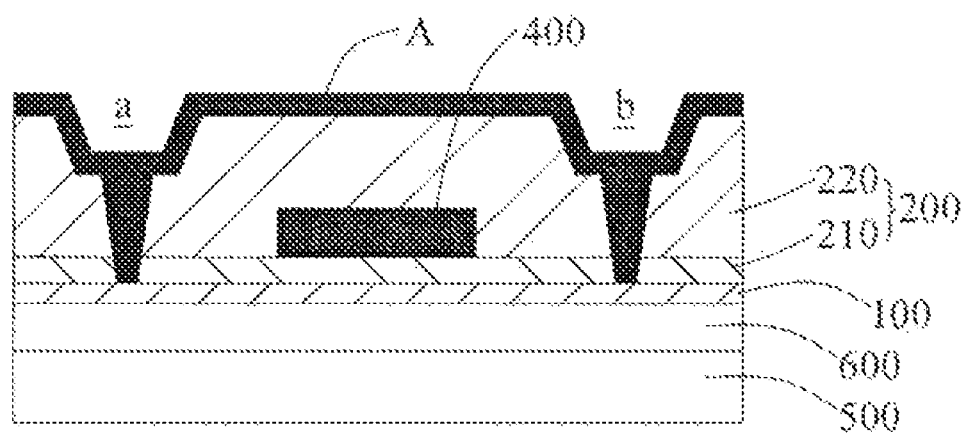
FIG. 2B is a diagram illustrating the structure of a thin film transistor having a source/drain metal layer in some embodiments.
Figure 2C:
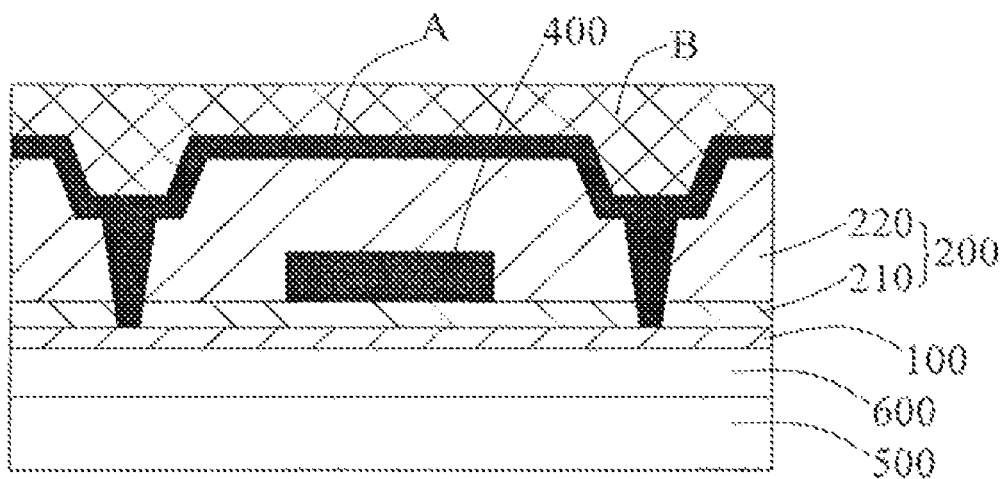
FIG. 2C is a diagram illustrating the structure of a thin film transistor having a photoresist layer on the source/drain metal layer in some embodiments.
Figure 2D:
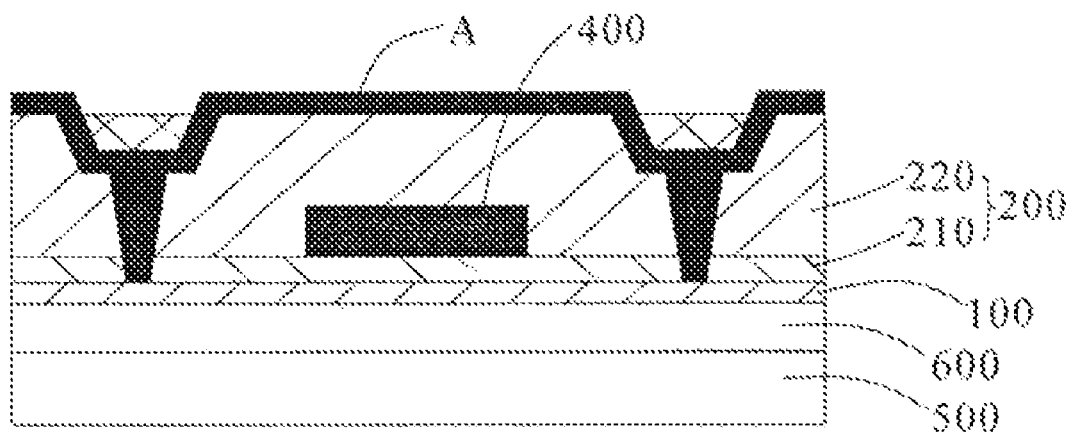
FIG. 2D is a diagram illustrating the structure of a thin film transistor having a mask formed by a photoresist in some embodiments.
Figure 2E:
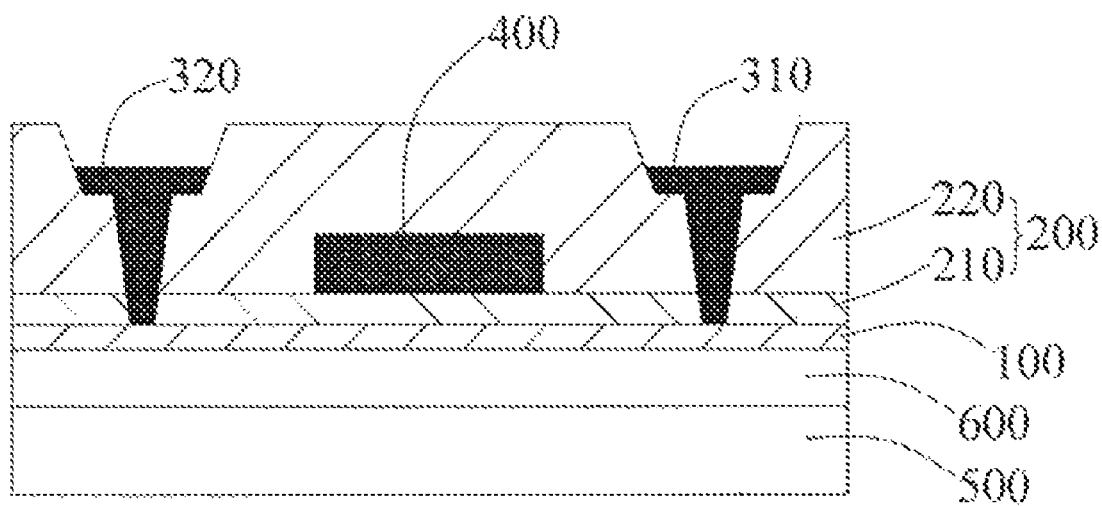
FIG. 2E is a diagram illustrating the structure of a thin film transistor having a source electrode and a drain electrode patterned in some embodiments.

FIGS. 2A-2E illustrate a method of fabricating a thin film transistor in some embodiments. Referring to FIG. 2A, the source via 410 (e.g., a step via) includes a first source sub-via 411 and a second source sub-via 412. Optionally, the first source sub-via 411 has a diameter larger than that of a second source sub-via 412. Optionally, the first drain sub-via 421 has a diameter larger than that of a second drain sub-via 422.

Referring to FIG. 2B, a source/drain electrode metal layer A is deposited on the substrate having the source via 410 and the drain via 420. The source/drain electrode metal material is deposited (e.g., fills or is sputtered) in the space inside the second source sub-via 412 and the second drain sub-via 422, and forms a layer of source/drain metal layer in the first source sub-via 411 and the first drain sub-via 421. Optionally, the source/drain electrode metal material fills in the space inside the second source sub-via 412 and the second drain sub-via 422, therefore the source/drain electrode metal layer A has a larger thickness within the second source sub-via 412 and the second drain sub-via 422 as compared to the remaining portions. Optionally, the source/drain electrode metal material is sputtered in the space inside the second source sub-via 412 and the second drain sub-via 422, therefore the source/drain electrode metal layer A within the second source sub-via 412 and the second drain sub-via 422 has a thickness comparable to that of other portions of the source/drain electrode metal layer A. As shown in FIG. 2B, after forming the source/drain electrode metal layer A, the substrate includes a recess a in the area corresponding to the drain electrode and a recess b in the area corresponding to the source electrode. Thus, the surface of the source/drain electrode metal layer A is not planar.

Referring to FIG. 2C, a photoresist layer B is formed over the source/drain electrode metal layer A. As shown in FIG. 2C, the surface of the photoresist layer B is planar. The thickness of the photoresist layer B is, however, not uniform. In areas corresponding to the source via (the recess a in FIG. 2B) and the drain via (the recess b in FIG. 2B), the photoresist layer B has a larger thickness as compared to the remaining area of the photoresist laser B.

Referring to FIG. 2D, the fabricating method further includes exposing the photoresist layer B (e.g., with a mask plate having a source/drain electrode pattern), developing the exposed photoresist layer to obtain a photoresist pattern corresponding to the source/drain electrode pattern, and removing (e.g., by ashing) the photoresist layer B in areas other than those corresponding to the source via and the drain via while maintaining the photoresist layer B in areas corresponding to the source via and the drain via. The source/drain electrode metal layer A is then etched in areas other than those corresponding to the source via and the drain via. The source electrode and the drain electrode is formed without the need of an additional mask plate.

Based on the above, the present disclosure provides a method of fabricating a thin film transistor with fewer number of mask plates used in the process. The manufacturing costs can thus be reduced.

Any appropriate semiconductor material may be used for making the active layer. Examples include, but are not limited to, metal oxides and polycrystalline silicon.

Referring to FIG. 2E, the thin film transistor in the embodiment is a top gate type thin film transistor having a gate electrode 400 insulated from the active layer 100 by the insulating layer 200. In some embodiments, the insulating layer 200 is on a side of the active layer 100 distal to the base substrate 500.

In some embodiments, the insulating layer 200 includes a gate insulating layer 210 and an interlayer insulating layer 220. The gate insulating layer 210 is on a side of the active layer 100 distal to the base substrate 500. The interlayer insulating layer 220 is on a side of the gate insulating layer 210 distal to the active layer 100. The gate electrode 400 is on a side of the gate insulating layer 210 distal to the active layer 100, and on a side of the interlayer insulating layer 220 proximal to the active layer 100. The first source sub-via and the first drain sub-via is within the interlayer insulating layer 220. The second source sub-via and the second drain sub-via span over the gate insulating layer 210 and a portion of the interlayer insulating layer 220.

The gate insulating layer 210 insulates the gate electrode 400 from the active layer 100. The interlayer insulating layer 220 insulates the gate electrode 400 from the source/drain electrodes 310 and 320. Any appropriate insulating material may be used for making the interlayer insulating layer, including, but are not limited to, silicon oxide ($SiO_x$), silicon nitride ($SiN_x$), and silicon oxynitride ($SiO_xN_y$). Any appropriate insulating material may be used for making the gate insulating layer, including, but are not limited to, silicon oxide ($SiO_2$), silicon nitride ($SiN_x$), silicon oxynitride ($SiO_xN_y$), and aluminum oxide.

In some embodiments, the thin film transistor further includes a base substrate 500, e.g., a glass substrate. To prevent contamination of the active layer 100 by the base substrate 500, the thin film transistor optionally includes a buffer layer 600 between the base substrate 500 and the active layer 100. Materials suitable for making the buffer layer 600 include, but are not limited to, silicon oxide ($SiO_x$), silicon nitride ($SiN_x$), and silicon oxynitride ($SiO_xN_y$).

Figure 3:
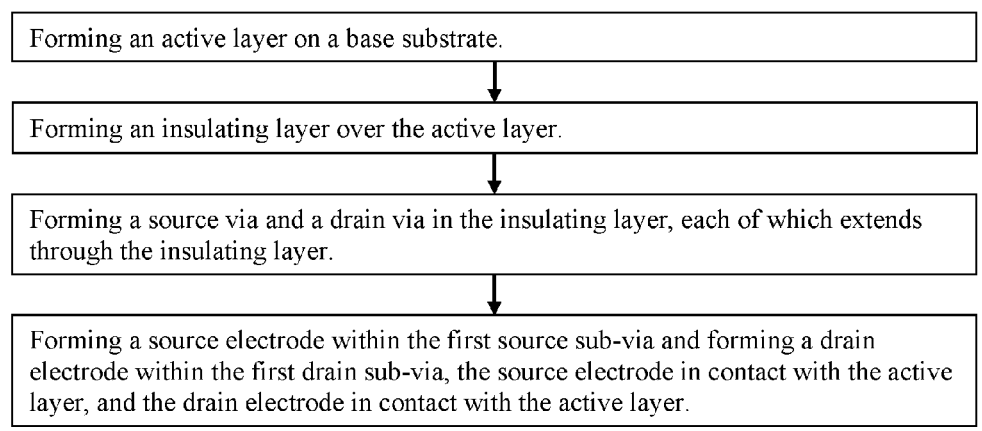
FIG. 3 is a flow chart illustrating a method of fabricating a thin film transistor in some embodiments.

FIG. 3 is a flow chart illustrating a method of fabricating a thin film transistor in some embodiments. Referring to FIG. 3, the method in the embodiment includes forming an active layer on a base substrate; forming an insulating layer over the active layer; and forming a source via and a drain via in the insulating layer, each of which extends through the insulating layer.

In some embodiments, the source via and the drain via are completely within the insulating layer. In some embodiments, the source via includes (e.g., consists of) a first source sub-via distal to the active layer and a second source sub-via proximal to the active layer, and the drain via includes (e.g., consists of) a first drain sub-via distal to the active layer and a second drain sub-via proximal to the active layer. Optionally, the first source sub-via and the first drain sub-via completely within the insulating layer. Optionally, the second source sub-via and the second drain sub-via are completely within the insulating layer. Optionally, the first source sub-via has a diameter larger than that of the second source sub-via, and the first drain sub-via has a diameter larger than that of the second drain sub-via. Optionally, the source via and the drain via are step vias, each having an upper portion and a lower portion. The upper portion is wider than the lower portion.

In some embodiments, the method further includes forming a source electrode within the source via and forming a drain electrode within the drain via. Optionally, the source electrode in contact with the active layer (e.g., through the second source sub-via). Optionally, the drain electrode in contact with the active layer (e.g., through the second drain sub-via). Optionally, the source electrode 310 and the drain electrode 320 are completely within the insulating layer 200. Optionally, the source electrode 310 includes (e.g., consists of) a first part within the first source sub-via and a second part within the second source sub-via, and the drain electrode 320 includes (e.g., consists of) a first part within the first drain sub-via and a second part within the second drain sub-via.

In some embodiments, the step of forming the insulating layer includes forming a gate insulating layer on a side of the active layer distal to the base substrate, and forming an interlayer insulating layer on a side of the gate insulating layer distal to the active layer. Optionally, the first source sub-via and the first drain sub-via is within the interlayer insulating layer. Optionally, the second source sub-via and the second drain sub-via span over the gate insulating layer and a portion of the interlayer insulating layer.

In some embodiments, the method further includes forming a gate electrode insulated from the active layer by the insulating layer. Optionally, the gate electrode is on a side of the gate insulating layer distal to the active layer, and on a side of the interlayer insulating layer proximal to the active layer.

In some embodiments, the step of forming the source electrode and forming the drain electrode includes depositing a source/drain electrode material on a side of the insulating layer distal to the active layer to form a source/drain electrode metal layer. The source/drain electrode material is deposited into the source via and the drain via. For example, the source/drain electrode metal layer extends through the first source sub-via and the second source sub-via and is in contact wife the active layer. Similarly, the source/drain electrode metal layer extends through the first drain sub-via and the second drain sub-via and is in contact with the active layer.

Subsequently, a photoresist layer is coated on a side of the source/drain electrode metal layer distal to the insulating layer. The photoresist layer can be made planar. In some embodiments, the method includes removing (e.g., by ashing) the photoresist layer other than a region above the source via and the drain via, exposing a portion of the source/drain electrode layer other than the portion corresponding to the source electrode and the drain electrode. The exposed portion of the source/drain electrode metal layer is then removed, e.g., by etching. The portion of the source/drain electrode metal layer corresponding to the source electrode and the drain electrode is covered by the photoresist layer and remains after the etching, thereby forming the source/drain electrode. Subsequently, the photoresist layer above the source/drain electrode is removed (e.g., by ashing).

Alternatively, in some embodiments, the method includes exposing the photoresist layer with a mask plate, developing the exposed photoresist layer to obtain a photoresist pattern having a first section corresponding to the source via and the drain via and a second section corresponding to remaining portion of the photoresist layer, and removing the photoresist layer in the second section. Once the photoresist layer in the second section is removed, the source/drain electrode metal layer is exposed and accessible for etching in the second section. Optionally, the method further includes etching the source/drain electrode metal layer in the second section. Optionally, the method further includes removing (e.g., by ashing) the photoresist layer in the first section.

Any appropriate etching method may be used for etching the source/drain electrode metal layer. Optionally, the etching method is a wet etching method in which an etching solution is used for removing the source/drain electrode metal in areas other than those corresponding to the source electrode and the drain electrode. Optionally, the etching method is a dry etching method. Optionally, when a dry etching method is used, the etching duration is controlled to ensure complete removal of source/drain electrode metal in areas other than those corresponding to the source electrode and the drain electrode, and at the same time maintaining the source/drain electrode metal layer in areas corresponding to the source electrode and the drain electrode.

Any appropriate ashing method may be used for ashing the photoresist layer. Optionally, a plasma is used in the ashing chamber.

When the source/drain electrode metal layer is deposited on the substrate having the source via and the drain via. The source/drain electrode metal material is deposited (e.g., fills or is sputtered) in the space inside the source via (e.g., the first source sub-via and the second source sub-via) and the drain via (e.g., the first drain sub-via and the second drain sub-via), and forms a layer of source/drain metal layer in the source via and the drain via. After forming the source/drain electrode metal layer, the substrate includes a recess in the area corresponding to the drain electrode and a recess in the area corresponding to the source electrode. Thus, the surface of the source/drain electrode metal layer A is not planar.

Subsequently, the photoresist layer is formed over the source/drain electrode metal layer. The surface of the photoresist layer can be made planar (e.g., using a scraping plate). The thickness of the photoresist layer is, however, not uniform. In areas corresponding to the source via and the drain via, the photoresist layer has a larger thickness as compared to the remaining area of the photoresist layer.

Subsequently, the fabricating method in some embodiments further includes removing (e.g., by ashing) the photoresist layer to expose a portion of the source/drain electrode metal layer other than a portion corresponding to the source electrode and the drain electrode. The exposed source/drain electrode metal layer is then etched. The source electrode and the drain electrode is formed without the need of an additional mask plate.

Based on the above, the present disclosure provides a method of fabricating a thin film transistor with fewer number of mask plates used in the process. The manufacturing costs can thus be reduced.

In some embodiments, the source via and the drain via are formed using a gray-tone mask plate or a half-tone mask plate. In some embodiments, the step of forming the source via and the drain via includes forming a photoresist layer on the insulating layer, exposing the photoresist layer with a gray-tone mask plate or a half-tone mask plate, and developing the exposed photoresist layer to obtain a pattern, i.e., a pattern having a first section corresponding to the source via and the drain via and a second section corresponding to remaining portion of the insulating layer. The first section includes a first zone corresponding to the second source sub-via and the second drain sub-via, and a second zone corresponding to remaining portions of the first section. Optionally, the method further includes removing the photoresist layer in the first zone, and removing a portion of the photoresist layer in second zone. Subsequently, the insulating layer within the first zone is removed and the insulating layer within the second zone is partially removed, e.g., by ashing. Alternatively, in some embodiments, the step of forming the source via and the drain via includes exposing the insulating layer with a gray-tone mask plate or a half-tone mask plate, and developing the exposed insulating layer so obtain a pattern, i.e., a pattern having a first section corresponding to the source via and the drain via and a second section corresponding to remaining portion of the insulating layer. The first section includes a first zone corresponding to the second source sub-via and the second drain sub-via, and a second zone corresponding to remaining portions of the first section. Optionally, the method further includes removing the insulating layer in the first zone thereby forming the second source sub-via and the second drain sub-via, and removing a portion of the insulating layer in the second zone thereby forming the first source sub-via and the first drain sub-via.

The gray-tone mask plate (or the half-tone mask plate) includes a transmissive section, a semi-light-shielding section, and a light-shielding section. When a positive photoresist is used, the transmissive section corresponds to the first zone, the semi-light-shielding section corresponds to the second zone, and the light-shielding section corresponds to the second section. When a negative photoresist is used, the light-shielding section corresponds to the first zone, the semi-light-shielding section corresponds to the second zone, and the transmissive section corresponds to the second section.

In some embodiments, the method further includes forming a buffer layer between the active layer and the base substrate prior to forming the active layer. Having a buffer layer can prevent contamination of the active layer by the base substrate. Materials suitable for making the buffer layer include, but are not limited to, silken oxide ($SiO_x$), silicon nitride ($SiN_x$), and silicon oxynitride ($SiO_xN_y$).

In some embodiments, the step of terming the active layer includes forming an amorphous silicon layer, annealing the amorphous silicon layer thereby forming a polycrystalline silicon layer, and patterning the polycrystalline silicon layer to form the active layer.

In some embodiments, the step of patterning the polycrystalline silicon layer includes coating a photoresist layer on the polycrystalline silicon layer, exposing the photoresist layer with a mask plate, developing the exposed photoresist layer to obtain a photoresist pattern corresponding to the active layer pattern; removing the photoresist layer outside the active layer region, etching the polycrystalline silicon layer in areas outside the active layer region thereby forming the active layer.

Based on the above, the present disclosure provides a method of fabricating a thin film transistor with fewer number of mask plates used in the process. The manufacturing costs can thus be reduced.

In another aspect, the present disclosure provides an array substrate having a thin film transistor described herein or manufactured by a method described herein. Because the present thin film transistor can be fabricated with a simpler fabrication process and a lower manufacturing costs, accordingly the present array substrate can be manufactured with a lower cost. The array substrate further includes other necessary components for image display. For example, the array substrate may be one for a light emitting diode display device, in which the array substrate includes a thin film transistor layer and a light emitting component layer. Optionally, the array substrate further includes a buffer layer between the base substrate and the active layer. Optionally, the array substrate further includes a source/drain line trench extending from a first source electrode in one thin film transistor to a second source electrode in a neighboring thin film transistor, the source/drain line trench is completely within insulating layer in an area corresponding to the source via. Optionally, the array substrate further includes a source/drain line in the source/drain line trench. Optionally, the source/drain line overlaps with a portion of the source electrode within the area corresponding to the source via (i.e., the source/drain line in the area corresponding to the source via is also completely within the insulating layer).

In another aspect, the present disclosure provides a display panel having an array substrate described herein. The display panel can be any appropriate type of display panel, such as a liquid crystal display panel and a light emitting diode display panel. A liquid crystal display panel includes the present array substrate, a counter substrate opposite to the array substrate, and a liquid crystal layer between the array substrate and the counter substrate. A light emitting diode display panel includes the present array substrate, a counter substrate opposite to the array substrate, and a light emitting diode. Because the present array substrate can be fabricated with a lower manufacturing costs, accordingly the present display panel can be manufactured with a lower cost.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
a thin film transistor;
a source/drain line trench; and
a source/drain line;
wherein the thin film transistor comprises:
an active layer on a base substrate;
an insulating layer over the active layer, the insulating layer comprising a source via and a drain via, each of which extends through the insulating layer;
a source electrode within the source via in contact with the active layer; and
a drain electrode within the drain via in contact with the active layer;

wherein the source electrode and the drain electrode are completely within the insulating layer;

the source/drain line trench extends from a first source electrode in one thin film transistor to a second source electrode in a neighboring thin film transistor, the source/drain line trench is completely within the insulating layer in an area corresponding to the source via; and the source/drain line is in the source/drain line trench.

2. The array substrate of claim 1, further comprising a buffer layer between the base substrate and the active layer.

3. A display panel, comprising the array substrate of claim 1.

4. The array substrate of claim 1, wherein the source via and the drain via are completely within the insulating layer.

5. The array substrate of claim 1, wherein the active layer is made of a material comprising a polycrystalline silicon.

6. The array substrate of claim 1, wherein the wherein the insulating layer is on a side of the active layer distal to the base substrate.

7. The array substrate of claim 1, wherein the source via comprises a first source sub-via distal to the active layer and a second source sub-via proximal to the active layer, the drain via comprises a first drain sub-via distal to the active layer and a second drain sub-via proximal to the active layer; the first source sub-via has a diameter larger than that of the second source sub-via, and the first drain sub-via has a diameter larger than that of the second drain sub-via.

8. The array substrate of claim 1, wherein the thin film transistor further comprises a gate electrode insulated from the active layer by the insulating layer;

wherein the insulating layer comprises a gate insulating layer and an interlayer insulating layer;

the gate insulating layer is on a side of the active layer distal to the base substrate;

the interlayer insulating layer is on a side of the gate insulating layer distal to the active layer; and the gate electrode is on a side of the gate insulating layer distal to the active layer, and on a side of the interlayer insulating layer proximal to the active layer.

9. The array substrate of claim 1, wherein the source/drain line overlaps with a portion of the source electrode within the area corresponding to the source via.

10. A method of fabricating a thin film transistor, comprising:

forming an active layer on a base substrate;

forming an insulating layer over the active layer;

forming a source via and a drain via in the insulating layer, each of which extending through the insulating layer; and forming a source electrode within the source via in contact with the active layer and forming a drain electrode within the drain via in contact with the active layer;

wherein the source electrode and the drain electrode are formed to be completely within the insulating layer;

wherein forming the source electrode and forming the drain electrode comprises:

depositing a source/drain electrode metal layer on a side of the insulating layer distal to the active layer, wherein the source/drain electrode metal layer extends through the source via and is in contact with the active layer, the source/drain electrode metal layer extends through the drain via and is in contact with the active layer;

coating a photoresist layer on a side of the source/drain electrode metal layer distal to the insulating layer;

removing the photoresist layer to expose a portion of the source/drain electrode metal layer other than a portion corresponding to the source electrode and the drain electrode; and etching exposed source/drain electrode metal layer.

11. The method of claim 10, wherein the source via and the drain via are formed to be completely within the insulating layer.

12. The method of claim 10, wherein the source via comprising a first source sub-via distal to the active layer and a second source sub-via proximal to the active layer, the drain via comprising a first drain sub-via distal to the active layer and a second drain sub-via proximal to the active layer; forming the source via and the drain via comprises:

using a gray-tone mask plate or a half-tone mask plate to obtain a pattern, wherein the pattern comprises a first section corresponding to the source via and the drain via and a second section corresponding to remaining portion of the insulating layer; the first section comprising:

a first zone corresponding to the second source sub-via and the second drain sub-via; and a second zone corresponding to remaining portions of the first section.

13. The method of claim 10, wherein forming the insulating layer comprises:

forming a gate insulating layer on a side of the active layer distal to the base substrate; and forming an interlayer insulating layer on a side of the gate insulating layer distal to the active layer.

14. The method of claim 13, further comprising forming a gate electrode insulated from the active layer by the insulating layer; the gate electrode is on a side of the gate insulating layer distal to the active layer, and on a side of the interlayer insulating layer proximal to the active layer.

15. The method of claim 10, wherein the source via comprises a first source sub-via distal to the active layer and a second source sub-via proximal to the active layer, the drain via comprises a first drain sub-via distal to the active layer and a second drain sub-via proximal to the active layer; the first source sub-via has a diameter larger than that of the second source sub-via, and the first drain sub-via has a diameter larger than that of the second drain sub-via.

16. The method of claim 10, wherein the insulating layer is on a side of the active layer distal to the base substrate.

17. A method of fabricating a thin film transistor, comprising:

forming an active layer on a base substrate;

forming an insulating layer over the active layer;

forming a source via and a drain via in the insulating layer, each of which extending through the insulating layer; and forming a source electrode within the source via in contact with the active layer and forming a drain electrode within the drain via in contact with the active layer;

wherein the source via is formed to comprise a first source sub-via distal to the active layer and a second source sub-via proximal to the active layer, the drain via is formed to comprise a first drain sub-via distal to the active layer and a second drain sub-via proximal to the active layer;

forming the source via and the drain via comprises:

using a gray-tone mask plate or a half-tone mask plate to obtain a pattern, wherein the pattern comprises a first section corresponding to the source via and the drain via and a second section corresponding to remaining portion of the insulating layer; the first section comprising:
a first zone corresponding to the second source sub-via and the second drain sub-via; and
a second zone corresponding to remaining portions of the first section.

18. The method of claim 17, wherein forming the active layer comprises forming an amorphous silicon layer, annealing the amorphous silicon layer thereby forming a polycrystalline silicon layer, and patterning the polycrystalline silicon layer to form the active layer.

* * * * *